United States Patent
Lee et al.

(10) Patent No.: US 10,416,692 B2
(45) Date of Patent: Sep. 17, 2019

(54) METHOD AND APPARATUS FOR REDUCING CAPACITOR-INDUCED NOISE

(71) Applicant: Apple Inc., Cupertino, CA (US)

(72) Inventors: Jong-Suk Lee, Sunnyvale, CA (US);
Ramesh B. Gunna, San Jose, CA (US);
Shih-Chieh Wen, San Jose, CA (US)

(73) Assignee: Apple Inc., Cupertino, CA (US)

( * ) Notice: Subject to any disclaimer, the term of this patent is extended or adjusted under 35 U.S.C. 154(b) by 51 days.

(21) Appl. No.: 15/708,229

(22) Filed: Sep. 19, 2017

(65) Prior Publication Data
US 2019/0086942 A1    Mar. 21, 2019

(51) Int. Cl.
*G05F 1/10*    (2006.01)
*G05F 1/46*    (2006.01)
*H03K 5/04*    (2006.01)
*H03K 19/003*    (2006.01)
*G06F 1/26*    (2006.01)

(52) U.S. Cl.
CPC ............ *G05F 1/46* (2013.01); *G06F 1/26* (2013.01); *H03K 5/04* (2013.01); *H03K 19/00346* (2013.01)

(58) Field of Classification Search
None
See application file for complete search history.

(56) References Cited

U.S. PATENT DOCUMENTS

| | | | |
|---|---|---|---|
| 5,740,453 A * | 4/1998 | Lada, Jr. | ............ H03F 1/305 330/149 |
| 6,650,594 B1 * | 11/2003 | Lee | ............ G11C 5/147 365/194 |
| 6,664,805 B2 | 12/2003 | Gonzalez | |
| 6,775,387 B1 * | 8/2004 | Mavencamp | ............ H03F 1/14 381/104 |
| 7,472,289 B2 | 12/2008 | Rodriguez | |
| 7,747,878 B2 | 6/2010 | Vyssotski | |
| 7,788,508 B1 | 8/2010 | Salmi | |
| 8,362,805 B2 | 1/2013 | Suzuki | |
| 9,489,031 B2 * | 11/2016 | de la Cropte de Chanterac | ............ G06F 1/3228 |
| 10,097,090 B1 * | 10/2018 | Ferencz | ............ H02M 1/36 |
| 2003/0217093 A1 | 11/2003 | Dailey | |
| 2003/0217295 A1 * | 11/2003 | Sadowski | ............ G06F 1/26 713/300 |
| 2004/0181700 A1 * | 9/2004 | Katoh | ............ G06F 1/3203 713/300 |
| 2006/0103639 A1 | 5/2006 | Ichiraku | |

(Continued)

*Primary Examiner* — Lincoln D Donovan
*Assistant Examiner* — Khareem E Almo
(74) *Attorney, Agent, or Firm* — Meyertons, Hood, Kivlin, Kowert & Goetzel, P.C.

(57) ABSTRACT

A method and apparatus for reducing capacitor noise in electronic systems is disclosed. A system includes at least one functional circuit block coupled to receive a variable supply voltage. The value of the supply voltage is controlled by a power management circuit. Changing a performance state of the functional circuit block includes increasing the supply voltage for higher performance, and reducing the supply voltage for reduced performance demands. The power management circuit, in changing to a higher performance state, increases the supply voltage at a first rate. A rate control circuit causes the power management circuit to reduce the supply voltage, when changing to a lower performance state, at a second rate that is less than the first rate.

19 Claims, 5 Drawing Sheets

(56) References Cited

U.S. PATENT DOCUMENTS

| | | | |
|---|---|---|---|
| 2006/0132109 A1* | 6/2006 | Rodriguez | G06F 1/3203 |
| | | | 323/282 |
| 2006/0136370 A1 | 12/2006 | Buckler | |
| 2008/0177424 A1 | 7/2008 | Wheeler | |
| 2010/0115343 A1 | 5/2010 | Floyd | |
| 2010/0191936 A1 | 7/2010 | Khatri | |
| 2010/0299545 A1 | 11/2010 | Lyu | |
| 2013/0346764 A1 | 12/2013 | Gullbrand | |
| 2014/0012987 A1 | 1/2014 | Jung | |
| 2014/0101420 A1 | 4/2014 | Wu | |
| 2015/0026699 A1 | 1/2015 | Nakamura | |
| 2015/0134982 A1 | 5/2015 | Park | |
| 2017/0133931 A1 | 5/2017 | Elsayet | |

\* cited by examiner

METHOD AND APPARATUS FOR REDUCING CAPACITOR-INDUCED NOISE

BACKGROUND

Technical Field

This disclosure relates to electronic systems, and more particularly, to methods and apparatus embodiments for reducing capacitor induced noise resulting from performance state changes.

Description of the Related Art

Modern computers and other electronic systems (including portable devices, such as smart phones) are often times configured to adjust performance parameters based on changing workloads. For example, for higher workloads, one or both of a supply voltage and clock frequency may be increased. This may enable circuitry (such as a processor core) to more quickly complete a current task. Thereafter, if performance demands decrease, the supply voltage and/or clock frequency may be reduced. In general, power management circuitry (or software) may cause performance level increases or decreases as desired and in accordance with application workloads. Moreover, in some cases, the performance level at any given time may be driven by particular applications executing on the computer system, and thus performance levels may be boosted or reduced based on the demands of that application.

SUMMARY

A method and apparatus for reducing capacitor noise in electronic systems is disclosed. In one embodiment, a system includes at least one functional circuit block coupled to receive a variable supply voltage. The value of the supply voltage is controlled by a power management circuit. Changing a performance state of the functional circuit block includes increasing the supply voltage for higher performance, and reducing the supply voltage for reduced performance demands. The power management circuit, in changing to a higher performance state, increases the supply voltage at a first rate. A rate control circuit causes the power management circuit to reduce the supply voltage, when changing to a lower performance state, at a second rate that is less than the first rate.

In one embodiment, the rate control circuit is coupled to receive performance state change requests. If the request is for a higher performance state (and thus a higher supply voltage), the rate control circuit conveys the request to the power management circuit. If the request is for a lower performance state (and thus a lower supply voltage), the rate control circuit splits the requests into a number of smaller requests. These requests are then conveyed, sequentially, to the power management circuit. As a result, with each of the smaller requests, the supply voltage is reduced in increments smaller than the overall request until the desired supply voltage is reached. By incrementally reducing the supply voltage, the rate of reduction can effectively be reduced, thereby reducing capacitor noise (e.g., "singing capacitor" noise) that might otherwise occur.

BRIEF DESCRIPTION OF THE DRAWINGS

The following detailed description makes reference to the accompanying drawings, which are now briefly described.

Figure 1:
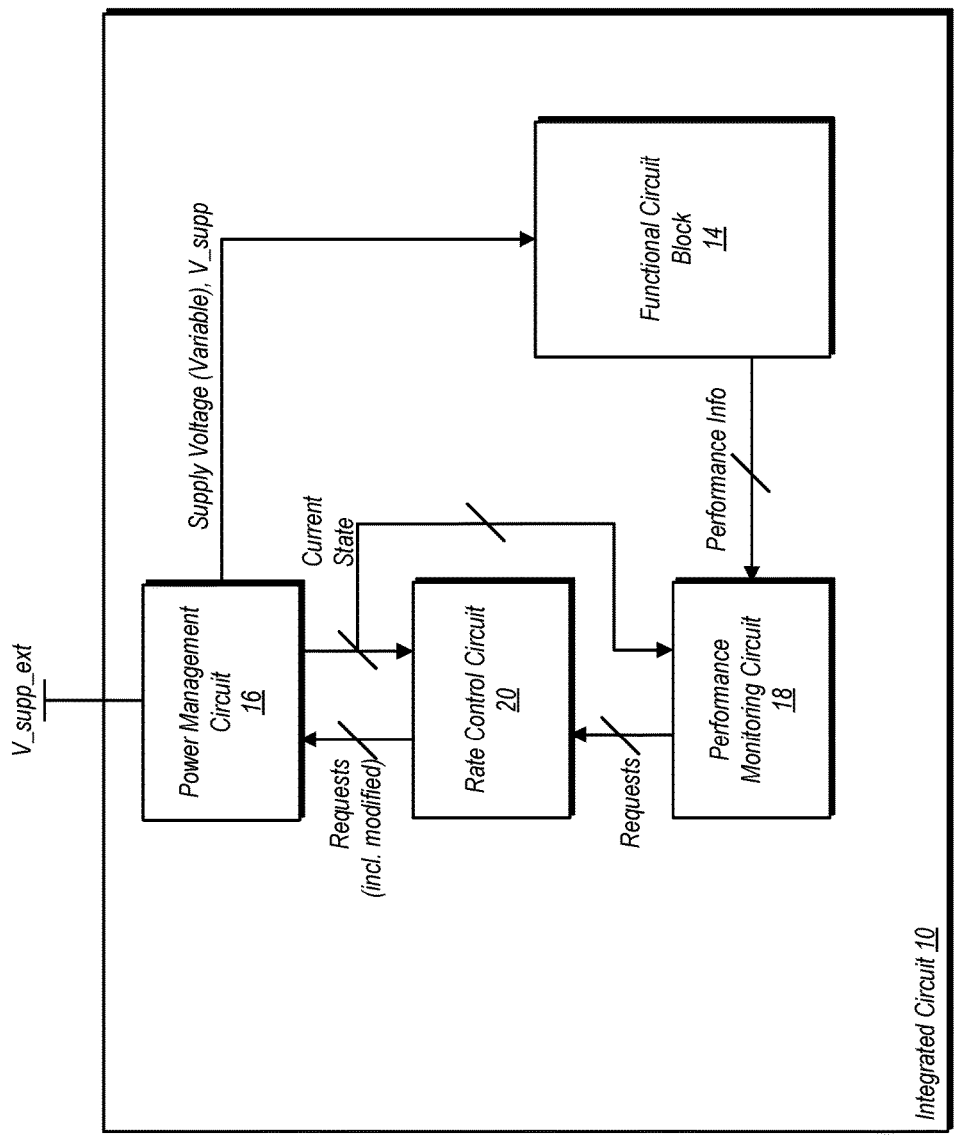
FIG. 1 is a block diagram of one embodiment of an integrated circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, a block diagram of one embodiment of an integrated circuit (IC) is shown. IC 10 as shown here is a simplified diagram presented for illustrative purposes, and thus is not intended to be limiting. On the contrary, a wide variety of ICs with various arrangements are possible and contemplated as falling within the scope of this disclosure.

IC 10 in the illustrated embodiment includes a functional circuit block 14, which is coupled to receive a supply voltage via a power management circuit 16. Functional circuit block 14 may be virtually any type of circuitry that can be implemented as an IC, including (but not limited to) a general purpose processor core, a graphics processing unit, memory interface circuitry, and so on. Furthermore, functional circuit block 14 may include digital, analog, and/or mixed-signal circuitry.

In some embodiments, functional circuit block 14 may receive voltage from a voltage regulator that is separate from power management circuit 16, or by any other suitable mechanism. Irrespective, the supply voltage received by functional circuit block is variable, and may be adjusted based on factors that include performance demands. For example, for a high performance demand, the variable supply voltage may be increased (along with other parameters, such as a clock frequency), while the variable supply voltage may be reduced when performance demand is lower.

Performance monitoring circuit 18 is coupled to receive performance information from functional circuit block 14. The performance information may be any type of information that is indicative of the performance demand of the circuit. Such performance metric may be indicative currently executing applications, thread counts, instructions per second, memory accesses, whether a particular application is computation intensive or memory access intensive, and so on. In general, any suitable information used to indicate the performance demands placed on or workload of functional circuit block 14 may be conveyed to performance monitoring circuit 18. In addition to receiving performance information from functional circuit block 14, performance monitoring circuit 18 is also coupled to receive current performance state information from power management circuit 16. The performance state information may include indications of the current supply voltage provided to functional circuit block 14, and may also including information about a current clock frequency.

Responsive to changes in performance demands on functional circuit block 14, performance monitoring circuit 18 may generate requests to change the performance state, which can include changes to the variable supply voltage. Performance state changes may also include changes to a frequency of a clock signal provided to functional circuit block 14, although this disclosure is primarily directed to voltage changes.

Performance state change requests initiated by performance monitoring circuit 18 may be initially conveyed to rate control circuit 20. Some requests, such as requests to increase the variable supply voltage responsive to an increased workload may pass through rate control circuit 20 unaltered, to power management circuit 16. However, when the request is to decrease the voltage, rate control circuit 20 may alter the request. In particular, rate control circuit may split the request to reduce the supply voltage into multiple, smaller requests. These requests are then conveyed, in sequence, to power management circuit 16, until either the desired supply voltage is reached, or prior thereto, another request to increase the supply voltage is received. The multiple requests, when carried out by power management circuit 16, may reduce the supply voltage at an average rate that is less than that at which the supply voltage is increased (responsive to a request for a higher supply voltage).

Reducing the supply voltage at a slower average rate may result in minimizing, if not eliminating, acoustic noise that can occur responsive to voltage decreases. Generally speaking, rapid changes in the supply voltage of some circuits can cause acoustic noise issues (e.g., "singing" capacitors). This effect may be more pronounced when there are frequent and/or periodic performance state changes that involve changing the supply voltage. However, by reducing the rate at which the supply voltage is decreased (relative to the rate at which the supply voltage is increased), these noise problems may be mitigated.

As noted above, rate control circuit 20 may split requests to reduce the supply voltage into multiple requests which are then conveyed and carried out in a sequential manner to reduce the overall average rate of decrease. In accomplishing this function rate control circuit 20, may use current state information, along with information regarding the request received from performance monitoring circuit 18. Each request may include information indicating the desired voltage to which the supply voltage is to be adjusted. This information may be compared with the current state information and used in splitting a request to reduce the supply voltage into a number of smaller requests. For example, the rate control circuit 20 may determine a difference between the current supply voltage and the desired supply voltage, and may determine a number of increments by which the supply voltage is to be reduced. The amount of reduction per increment may also be determined using this information, as well as information regarding a desired rate of reduction. Using such information, the rate control circuit may split a single request to reduce the supply voltage into a number of smaller requests. Each of the smaller requests, when carried out, reduce the supply voltage by a portion of the overall amount of reduction. In one embodiment, each reduction in the supply voltage as one of a number of requests from a larger split request may be equal with the other ones of the smaller requests. After performing the calculations and splitting the request into smaller requests, the rate control circuit 20 may sequentially convey the smaller requests to power management circuit 16 at a rate commensurate with the desired average rate of reduction.

It is noted that in some embodiments, at least some of the functions of the various circuits shown in FIG. 1 may be carried out by software. For example, some or all of the functions of performance monitoring circuit 18 may be performed by software. Similarly, at least some of the functions of rate control circuit 20 may be implemented in software for various embodiments. Generally speaking, while the embodiment of FIG. 1 is directed to circuitry, embodiments are possible and contemplated where various functions may be carried out by software and/or firmware in addition to those carried out by hardware.

Figure 2:
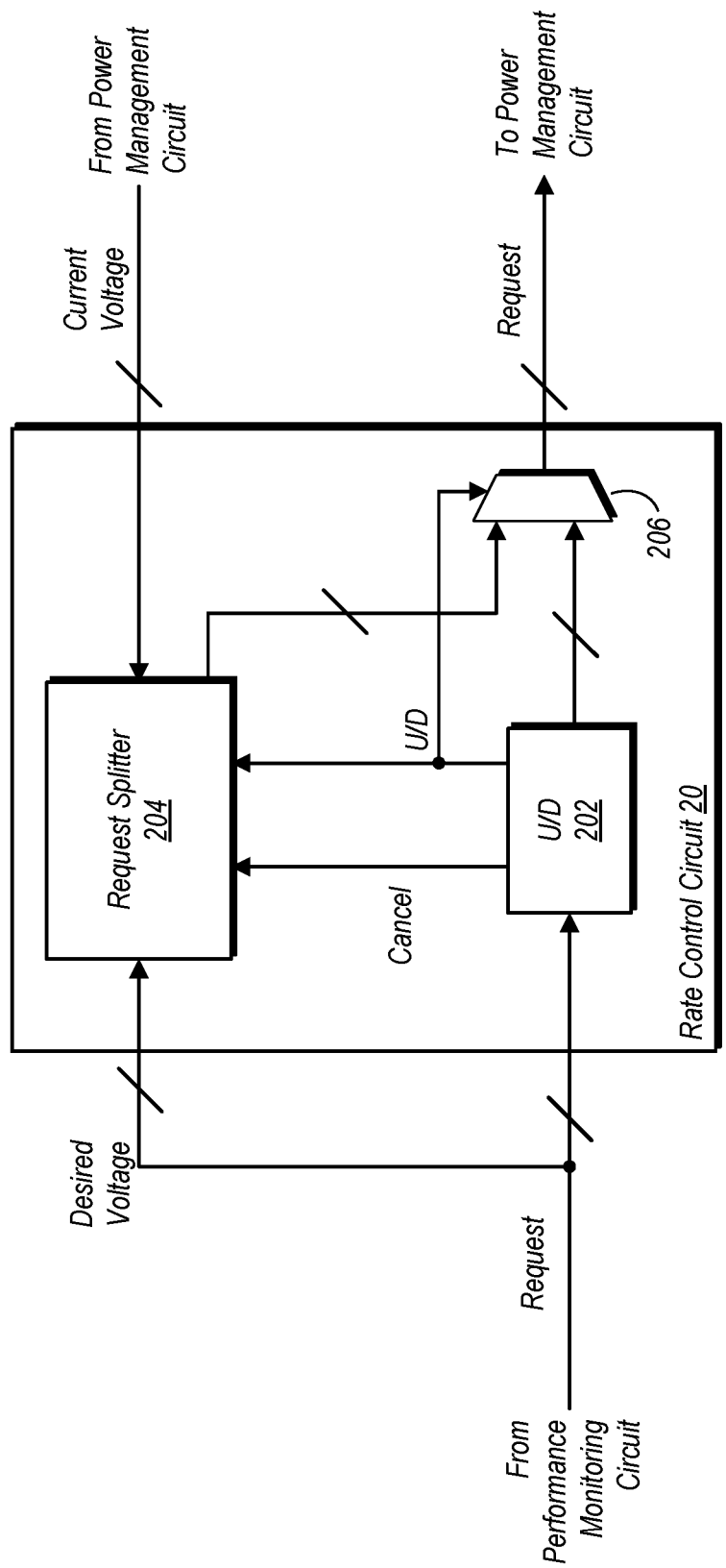
FIG. 2 is a block diagram of one embodiment of a rate control circuit.

FIG. 2 is a block diagram of one embodiment of a rate control circuit. Rate control circuit 20 as shown herein is but one example of a number of possible embodiments. In general, any type of circuitry or combination of hardware, software, and/or firmware capable of splitting a single request into multiple, smaller requests can be considered to fall within the scope of this disclosure.

In the illustrated embodiment, rate control circuit includes an up/down (U/D) circuit 202 and a request splitter 204. U/D circuit 202 in the embodiment shown is coupled to receive the request from the performance monitoring circuit. The request may include various information, including the direction of the voltage change (up or down) and the desired amount. Alternatively, the request may include information indicating the desired value of the supply voltage as well as the direction. U/D circuit 202 may determine if the request is to increase or decrease the supply voltage. Based on this determination, a U/D signal may be provided to multiplexer 206, which may select and convey a request from either U/D circuit 202 or request splitter 204 depending on its state. In the case that the request is to increase the supply voltage, the U/D signal may cause multiplexer 206 to select the request from U/D circuit 202, which is then conveyed to the power management circuit unaltered (i.e. as originally received by rate control circuit 20).

In the case in which the request involves a reduction of the supply voltage, U/D circuit 202 the U/D signal state is set to indicate a decrease in the supply voltage. Request splitter 204 in this particular embodiment receives the U/D signal, the desired value to which the supply voltage is to be reduced (from the performance monitoring circuit) and the current value of the supply voltage (from the power management circuit). Request splitter 204 then breaks the single request into multiple requests. Additionally, multiplexer 206 selects the output of request splitter 204 responsive to the U/D signal indicating receipt of a request to reduce the supply voltage.

Splitting the requests may be accomplished in multiple ways, as will be evident to those skilled in the art. For example, request splitter 204 may determine a difference between the current value of the supply voltage and the desired value, and divide that by a number of increments to determine the amount of voltage reduction per increment. Additionally, request splitter may determine the timing of the multiple requests (i.e. when each is conveyed) such that the overall average rate of the supply voltage reduction is commensurate with a desired rate of reduction. Generally speaking, request splitter 204 may implement various logic circuits, including arithmetic circuitry, timing circuits (e.g., counters, timers, etc.), registers for storing information, and so forth, in order to accomplish the splitting of a single request to reduce the supply voltage into multiple requests. In some embodiments, software and/or firmware may also be implemented as at least part of request splitter 204.

The multiple requests that are generated by request splitter 204 are conveyed, sequentially via multiplexer 206, to the power management circuit. The power management circuit then carries out each request, reducing the supply voltage by a fraction of the overall reduction. Upon completion of all the multiple requests, the supply voltage is brought to the desired level of the original request.

U/D circuit 202 is also configured to generate a 'Cancel' signal. This signal may be asserted responsive to receiving a request to increase the supply voltage. When the 'Cancel' signal is asserted, request splitter 204 may cancel any remaining ones of multiple requests generated responsive to an original request to reduce the supply voltage. Additionally, the U/D signal causes multiplexer 206 to select the output from U/D circuit 202 for conveying the request to increase the supply voltage to the power management circuit.

Figure 3:
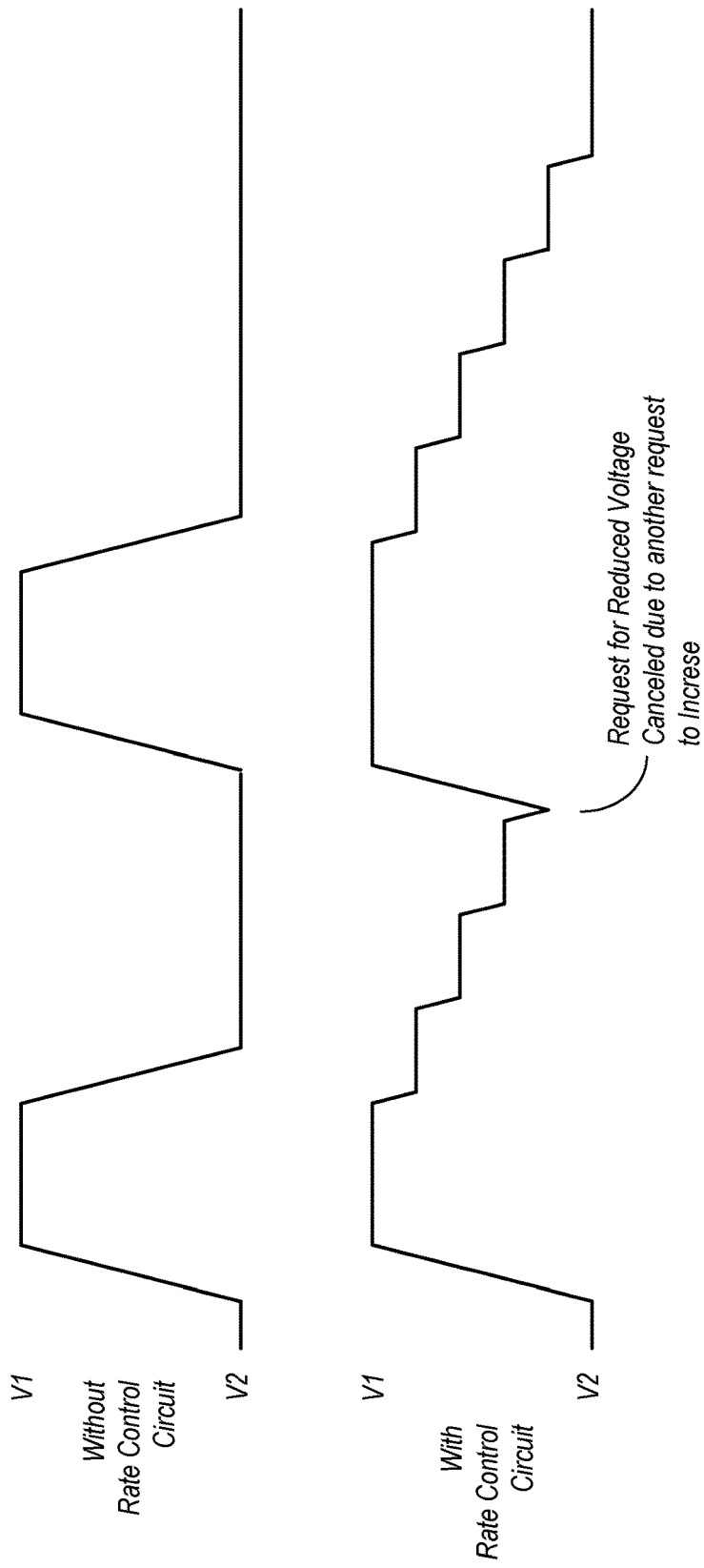
FIG. 3 is a timing diagram illustrating operation of one embodiment of a rate control circuit.

FIG. 3 is a timing diagram illustrating operation of one embodiment of a rate control circuit. More particularly, FIG. 3 illustrates the contrast between operation in different embodiments with and without the rate control circuit.

In the embodiment in the upper portion of FIG. 3, no rate control circuit is present. Responsive to a request to increase the voltage (corresponding to a higher performance state), the voltage is increased from V2 to V1. The functional circuit block receiving the supply voltage may operate at V1 for a time until a subsequent request is received to reduce the supply voltage (corresponding to a lower performance state). Responsive to the request to reduce, the supply voltage is reduced back to V2. The rate of reduction to V2 may be substantially equal to the rate of increase to V1. This sequence then occurs a second time as illustrated, and may occur any number of times during operation of the corresponding circuits.

In the embodiment shown in the lower portion of FIG. 3, a rate control circuit is present. Responsive to a request to increase, the supply voltage is raised from V2 to V1. After operating at V1 for some time, another request is received to reduce the voltage to V2. However, this request is split into multiple requests that are carried out in sequence as shown in FIG. 2. Each of the multiple requests results in a reduction by an amount that is a fraction of the overall requested reduction from V1 to V2. Thus, the supply voltage is incrementally reduced, resulting in an average rate of reduction that is less than the rate of increase from V2 to V1.

Prior to completing the first request in the illustrated example, a request to increase the voltage back to V1 is received. Thereafter, the remaining ones of the multiple requests (or, the remaining increments of voltage reduction) are canceled and the voltage is increased back to V1 at the same rate as the initial increase. After operating again at V1 for some time, another request to reduce the supply voltage to V2 is received. Again, the request is split into multiple requests, each of which, when carried out, reduces the supply voltage a fraction of the overall amount. In this second example, all of the multiple requests are carried out until the supply voltage is reduced to the desired value of V2.

It is noted while only two supply voltage levels are shown here (for the sake of simplicity), embodiments in which a number of different supply voltages are available are possible and contemplated, and fall within the scope of this disclosure. For example, a scenario in which the supply voltage is increased from V2 to V1, with a subsequent reduction to a third value that is different from V2 is possible within the scope of this disclosure. As previously noted, the average rate of reduction may be less than the rate of increase, irrespective of the value to which the supply voltage is to be reduced. Furthermore, the number and size of the increments may vary from embodiment to embodiments, and may also vary within a particular embodiment, based on factors such as the desired supply voltage, the desired rate of decrease, the desired number of increments at which the voltage is to be reduced, and so on.

Figure 4:
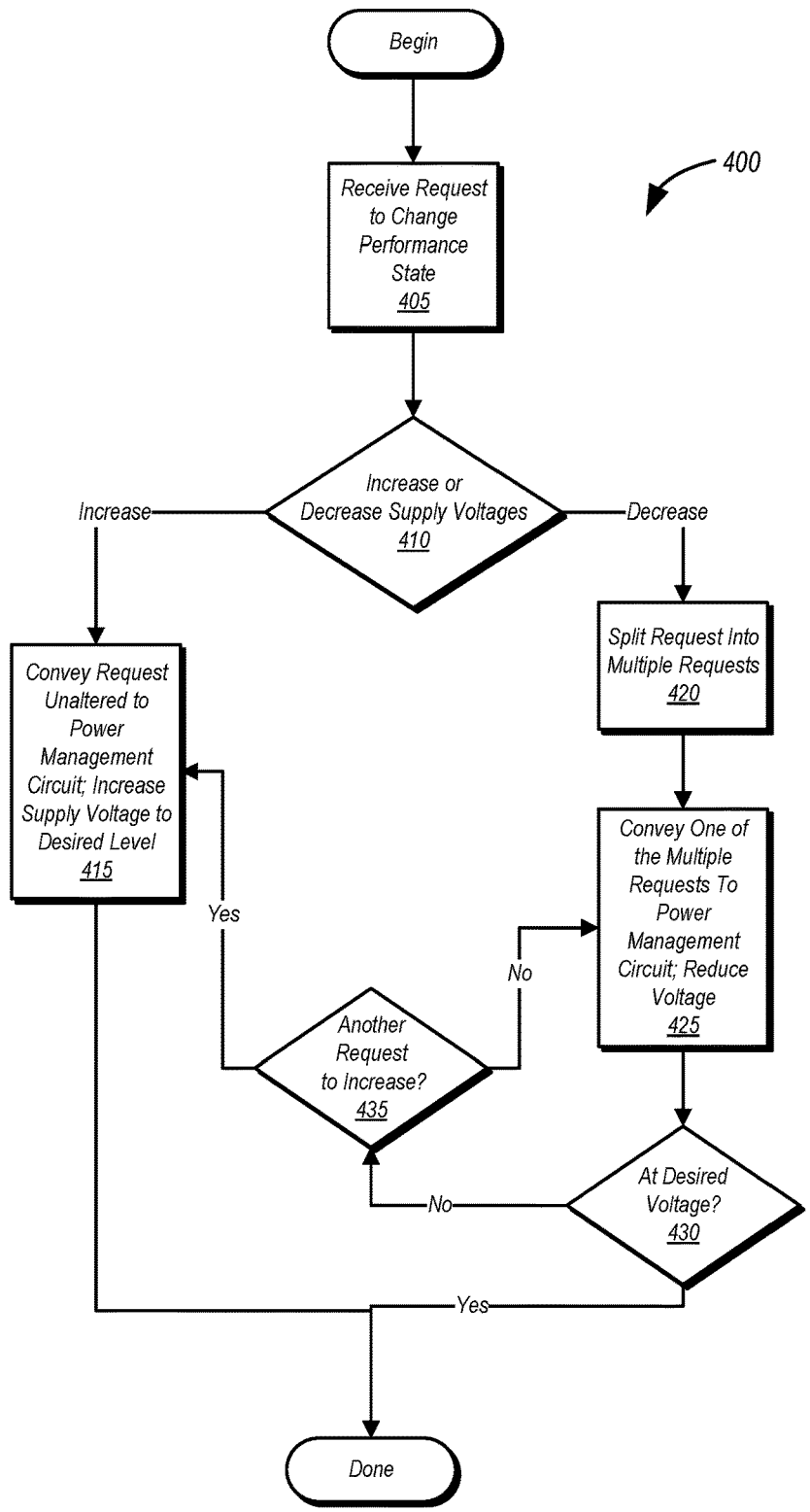
FIG. 4 is a flow diagram of one embodiment of method for controlling supply voltage changes in an electronic system.

FIG. 4 is a flow diagram of one embodiment of method for controlling supply voltage changes in an electronic system. Method 400 may be used with the various embodiments of an IC and a rate control circuit/unit as discussed above. Embodiments of method 400 performed by other circuits/firmware/software not explicitly discussed herein are also possible and contemplated. Such embodiments may thus fall within the scope of this disclosure.

Method 400 begins with the rate control unit/circuit receiving a request to change the performance state (block 405). For this particular implementation, the change in performance state includes a change of the supply voltage that is provided to a functional circuit block. If the request includes increasing the supply voltage provided to the functional circuit block (block 410, Increase), then the request is conveyed by the rate control circuit, unaltered, to the power management circuit and the supply voltage is increased responsive thereto (block 415), and the method completes.

If the request includes decreasing the supply voltage (block 410, decrease), then the rate control circuit may then split the request into multiple requests (block 420). Each of the multiple requests is one of a number of increments of supply voltage reduction, with the sum of these reductions being equal to the overall supply voltage reduction of the original request. In some embodiments, the increments may be of equal size (i.e., equal amount of supply voltage reduction for each increment), although embodiments where at least some increments may be of different sizes are possible and contemplated. Overall, the splitting of the request into multiple requests may be done so that the supply voltage is reduced at a desired average rate that is less than the rate at which the supply voltage is increased responsive to requests for a higher performance state.

After the request to decrease the supply voltage has been split into multiple requests, the rate control circuit may convey one of the multiple requests to the power management circuit, which may reduce the supply voltage by a specified amount (block 425). As noted above, the specified amount of voltage reduction may be a portion of the overall reduction as indicated in the original request prior to splitting. If the supply voltage is not yet at the desired voltage (block 430, no), and a subsequent request to increase the supply voltage has not been received (block 435, no), method 400 returns to block 425. This loop may continue until the supply voltage has been reduced to the desired voltage indicated in the original request (block 430, yes). However, if a subsequent request to increase the supply voltage occurs prior to reaching the desired voltage (block 435, yes), method 400 proceeds to block 415. Additionally, responsive to the request to increase the supply voltage, any remaining ones of the multiple requests (i.e. those generated responsive to the original request to reduce the supply voltage) are canceled.

Figure 5:
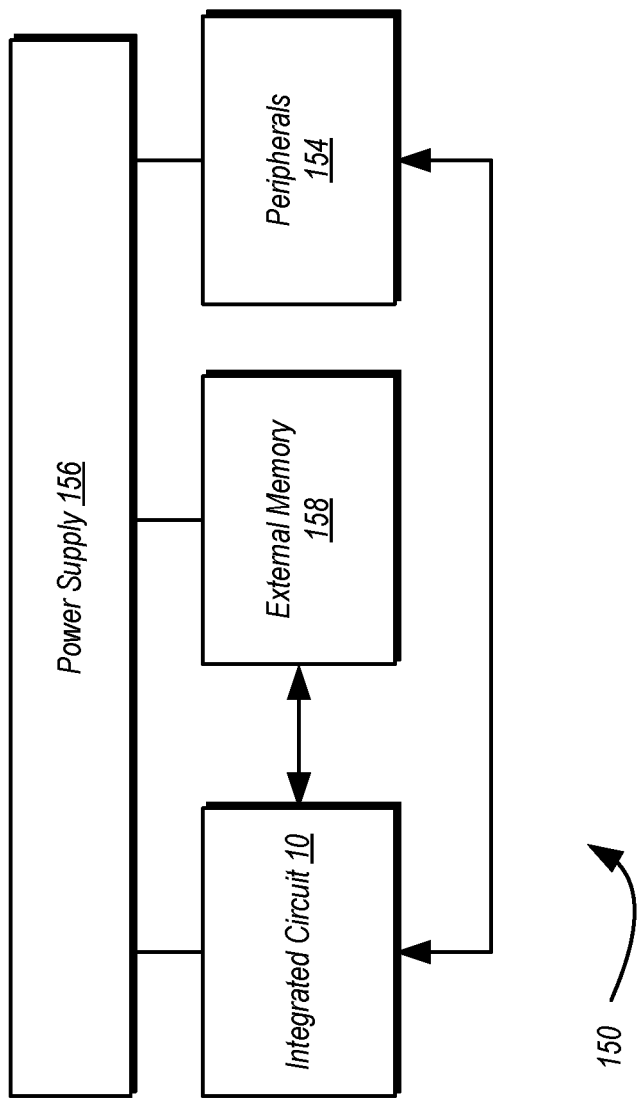
FIG. 5 is block diagram of one embodiment of an exemplary system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a functional circuit block coupled to receive a variable supply voltage;
   a power management circuit configured to control the variable supply voltage, wherein responsive to a first performance state change request, the power management circuit is configured to increase, at a first rate and to a first voltage, the variable supply voltage provided to the functional circuit block; and a rate control circuit configured to, responsive to a second performance state change request subsequent to the first performance state change request, cause the power management circuit to reduce, incrementally at a second rate, the variable supply voltage provided to the functional circuit block, wherein the second rate is less than the first rate, wherein responsive to receiving a third performance state change request to increase the variable supply voltage prior to completing the second performance state change request, the rate control circuit is configured to cancel the second performance state change request.

2. The integrated circuit as recited in claim 1, wherein the rate control circuit is configured to split the second performance state change request into a plurality of performance state change requests, and further configured to sequentially convey each of the plurality of performance state change requests to the power management circuit.

3. The integrated circuit as recited in claim 2, wherein the second performance state change request comprises reducing the variable supply voltage to a second voltage, and wherein each of the plurality of performance state change requests comprises reducing the variable supply voltage by an amount that is less than a difference between the first voltage and the second voltage.

4. The integrated circuit as recited in claim 2, wherein each of the plurality of performance state change requests corresponds to an increment at which the variable supply voltage is to be reduced, and wherein each of the plurality of performance state changes reduces the variable supply voltage in equal increments.

5. The integrated circuit as recited in claim 1, further comprising a performance monitoring circuit coupled to the rate control circuit, wherein the performance monitoring circuit is configured to convey performance state change requests to the power management circuit, via the rate control circuit.

6. The integrated circuit as recited in claim 1, wherein the rate control circuit is configured to, responsive to receiving the second performance state change request, determine a difference between the first voltage and a second voltage to which the variable supply voltage is to be reduced, and further configure to determine an amount of reduction of the variable supply voltage for each of a number of increments.

7. The integrated circuit as recited in claim 1, wherein the rate control circuit is configured to convey to the power management circuit, without altering, requests to increase the variable supply voltage.

8. A method comprising:
increasing, to a first voltage and at a first rate, a supply voltage provided to a functional circuit block of an integrated circuit responsive to a first performance state change request; and
incrementally decreasing, to a second voltage at a second rate less than the first rate, the supply voltage provided to the functional circuit block responsive to a second performance state change request.

9. The method as recited in claim 8, further comprising:
a rate control circuit receiving the second performance state change request;
the rate control circuit splitting the second performance state change request into a plurality of requests, wherein each of the plurality of requests comprises a request to reduce the supply voltage; and
sequentially conveying each of the plurality of requests from the rate control circuit to a power management circuit.

10. The method as recited in claim 9, further comprising the power management circuit reducing the supply voltage responsive to receiving each of the plurality of requests, wherein reducing the supply voltage comprises equal amounts of reduction for each of the plurality of requests.

11. The method as recited in claim 9, further comprising the rate control circuit:
determining a difference between the first voltage and the second voltage;
determining a number of the plurality of requests; and
determining an amount of reduction of the supply voltage for each of the plurality of requests.

12. The method as recited in claim 9, further comprising the rate control circuit conveying to the power management circuit, without altering, requests to increase the supply voltage.

13. The method as recited in claim 9, further comprising a performance monitoring circuit conveying performance state change requests, including the first and second performance state change requests, to the power management circuit, via the rate control circuit.

14. The method as recited in claim 8, further comprising canceling the second performance state change request, prior to reducing the supply voltage to the second voltage, responsive to receiving a third performance state change request, wherein the third performance state change request comprises increasing the supply voltage.

15. A system comprising:
a functional circuit block;
a power management circuit configured to control a value of a supply voltage provided to the functional circuit block;
a performance monitoring unit configured to monitor performance of the functional circuit block, and further configured to generate performance state change requests comprising requests to change the value of the supply voltage; and
a rate control circuit coupled to receive performance state change requests from the performance monitoring unit and further coupled to convey corresponding requests to the power management circuit, wherein the rate control circuit is configured to, responsive to receiving a performance state change request to reduce the supply voltage by a first amount, split the performance state change request into a plurality of requests each requesting a reduction in the supply voltage by an amount that is less than the first amount.

16. The system as recited in claim 15, wherein the rate control circuit is further configured to sequentially convey each of the plurality of requests to the power management circuit, wherein the power management circuit is configured to incrementally reduce the supply voltage, by the first amount, responsive to having received all of the plurality of requests.

17. The system as recited in claim 15, wherein the rate control circuit is configured to, responsive to receiving a performance state change request to increase the supply voltage, cancel any remaining ones of the plurality of requests.

18. The system as recited in claim 15, wherein the rate control circuit is configured to convey to the power management circuit, without altering, requests to increase the supply voltage initiated by the performance monitoring circuit.

19. The system as recited in claim 15, wherein the power management circuit is configured to increase the supply voltage at a first rate responsive to a request to a first performance state change request, and wherein the rate control circuit is configured to cause the power management circuit to reduce the supply voltage at a second rate responsive to a second performance state change request, wherein the second rate is less than the first rate.

\* \* \* \* \*